United States Patent
Ami et al.

(10) Patent No.: US 6,749,686 B2
(45) Date of Patent: Jun. 15, 2004

(54) CRYSTAL GROWTH METHOD OF AN OXIDE AND MULTI-LAYERED STRUCTURE OF OXIDES

(75) Inventors: Takaaki Ami, Kanagawa (JP); Yuichi Ishida, Kanagawa (JP); Naomi Nagasawa, Kanagawa (JP); Masayuki Suzuki, Kanagawa (JP); Akio Machida, Kanagawa (JP)

(73) Assignee: Sony Corporation, Tokyo (JP)

( * ) Notice: Subject to any disclaimer, the term of this patent is extended or adjusted under 35 U.S.C. 154(b) by 236 days.

(21) Appl. No.: 10/127,155

(22) Filed: Apr. 19, 2002

(65) Prior Publication Data

US 2002/0119659 A1 Aug. 29, 2002

Related U.S. Application Data

(62) Division of application No. 09/533,234, filed on Mar. 22, 2000, now abandoned.

(30) Foreign Application Priority Data

Mar. 26, 1999 (JP) .......................................... P11-084921

(51) Int. Cl.⁷ .......................... C30B 25/02; C30B 33/02
(52) U.S. Cl. ................................. 117/84; 117/3; 117/88; 117/89; 117/92
(58) Field of Search ................................. 117/84, 88, 89, 117/92, 3

(56) References Cited

U.S. PATENT DOCUMENTS

| 5,296,458 | A | * | 3/1994 | Himpsel | ..................... | 505/473 |
| 6,121,647 | A | * | 9/2000 | Yano et al. | ................. | 257/295 |
| 6,610,548 | B1 | * | 8/2003 | Ami et al. | ...................... | 438/3 |
| 2003/0136331 | A1 | * | 7/2003 | Ami et al. | ...................... | 117/2 |

* cited by examiner

*Primary Examiner*—Nadine G. Norton
*Assistant Examiner*—Matthew Anderson
(74) *Attorney, Agent, or Firm*—Sonenschein, Nath & Rosenthal LLP

(57) ABSTRACT

An epitaxial rare earth oxide (110)/silicon (001) structure is realized by epitaxially growing a rare earth oxide such as cerium dioxide in the (110) orientation on a (001)-oriented silicon substrate at a growth temperature lower than conventional ones. For this purpose, the surface of the (001)-oriented Si substrate is processed into a dimer structure by 2×1, 1×2 surface reconstruction, and a rare earth oxide of a cubic system or a tetragonal system, such as $CeO_2$ film, is epitaxially grown in the (110) orientation on the Si substrate in an atmosphere containing an oxidic gas by using a source material made up of at least one kind of rare earth element. During this growth, a source material containing at least one kind of rare earth element is supplied after the supply of an oxidic gas is supplied onto the surface of the Si substrate.

29 Claims, 12 Drawing Sheets

HOMOEPITAXIALLY GROWN (110) $CeO_2$ FILM (SECOND GROWTH TEMPERATURE)

$CeO_2$ FILM (FIRST GROWTH TEMPERATURE)

(001) Si SUBSTRATE

SURFACE HAVING FORMED THE DIMER STRUCTURE
BY 2x1, 1x2 SURFACE RECONSTRUCTION

*Fig.* 9
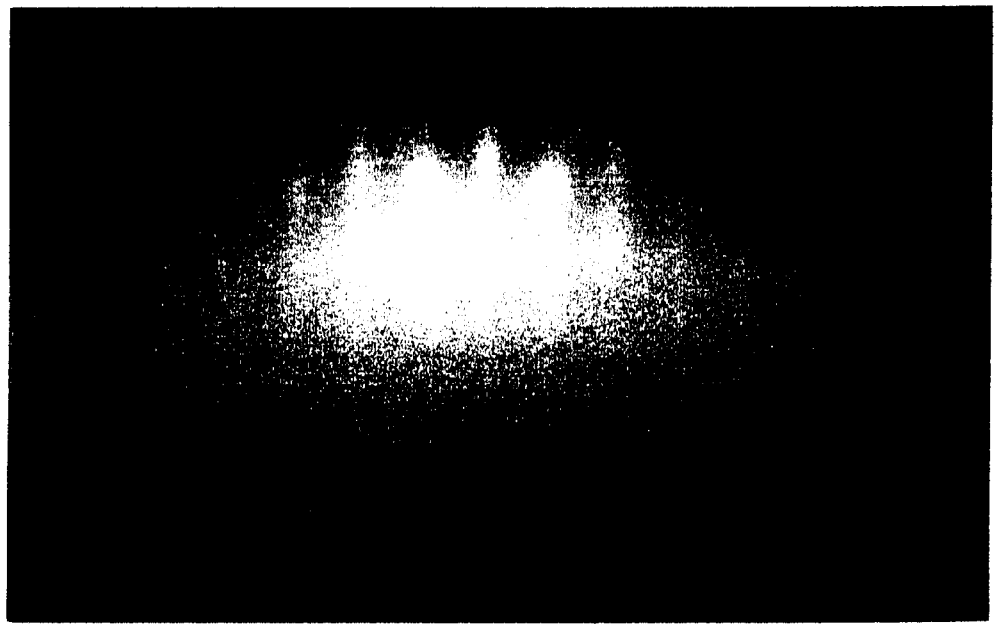
CeO$_2$ (110) FILM  ⟨001⟩, ⟨1$\bar{1}$0⟩ INCIDENCE

HOMOEPITAXIALLY GROWN
CeO$_2$ (110) FILM $\langle 001 \rangle$, $\langle 1\bar{1}0 \rangle$ INCIDENCE

CRYSTAL GROWTH METHOD OF AN OXIDE AND MULTI-LAYERED STRUCTURE OF OXIDES

RELATED APPLICATION DATA

The present application claims priority to Japanese Application No. 11-084921, filed Mar. 26, 1999, and is a divisional of U.S. application Ser. No. 09/533,234, filed Mar. 22, 2000, now abandoned, both of which are incorporated herein by reference to the extent permitted by law.

BACKGROUND OF THE INVENTION

1. Field of the Invention

This invention relates to a crystal growth method of an oxide and a multi-layered structure of oxides particularly suitable for application to oxide electronics developed on silicon substrates.

2. Description of the Related Art

Silicon oxide ($SiO_2$) films made by thermal oxidation of silicon (Si) have been exclusively used as gate insulating films of MOS-FET (metal-oxide-semiconductor FET) because of their high electric insulating ability, low interface state density, easiness to process, thermal stability, and other advantages. These $SiO_2$ films made by thermal oxidation for use as gate insulating films, however, have low specific dielectric constants ($\epsilon_r$ ~3.8) and must be formed very thin on Si substrates. Along with the progress toward thinner gate insulating films, short channels and other requirements to meet the demand for integration, various problems arose such as dielectric break-down of gate insulating films and pinch-off of channels caused by influences from source-drain voltages (short channel effect), and gate insulating films will soon come to the limit in terms of their materials. Under the circumstances, the need for new gate insulating films having high dielectric constants is being advocated as a technical subject of MOS-FET of the sub 0.1 micron generation, in addition to a further progress of lithographic technologies, needless to say (for example, (1) MTL VLSI Seminar (Massachusetts Institute of Technology)). If EL gate insulating film can be made by using a material of a high dielectric constant, it will need not be so thin. Therefore, gate leakage will be prevented, and short-channel effects will be prevented as well.

On the other hand, researches on ferroelectric non-volatile memories (FeRAM) have come to be active (for example, (2) Appl. Phys. Lett., 48(1986)1439, (3) IEDM Tech. Dig., (1987)850, (4) IEEE J. Solid State Circuits, 23(1988)1171, (5) 1988 IEEE Int. Solid-State Circuits Conf. (ISSCC88), (6) Digest of Technical Papers, THAM 10.6 (1988)130, and (7) Oyo Butsuri, 62(1993)1212). Among these ferroelectric non-volatile memories, what is considered to be closest to practical use is a ferroelectric non-volatile memory of a quasi-DRAM structure (using two-transistors and two-capacitors type memory cells, or one-transistor and one-capacitor type memory cells). This structure is advantageous in making it easier to prevent interference with the Si process because CMOS process and ferroelectric capacitor process can be separated by using an inter-layer insulating film. However, the structure of this ferroelectric non-volatile memory does not meet the use of a scaling law of a Si device. Therefore, as microminiaturization progresses, it is necessary to employ a more complex structure or use a material with a larger value of residual polarization in order to ensure a certain amount of charge storage in the capacitor. On the other hand, there are many research institutes tackling with the study of ferroelectric non-volatile memories using MFS (metal-ferroelectrics-semiconductor)-FET memory cells, including MFMIS (metal-ferroelectrics-metal-insulator-semiconductor)-FET memory cells, FCG (ferroelectric capacitor gate) memory cells, and so forth), which constitute two major subjects together with those of a quasi-DRAM structure mentioned above. The latter type ferroelectric non-volatile memories match with the scaling low, and merely need a very small value of residual polarization (about ~0.1 $\mu C/cm^2$). Additionally, since they need only one transistor for storage and hence contribute to a decrease of the cell size, they are advantageous for high integration. Furthermore, since they are of a nondestructive readout type, they are more advantageous also against fatigue, which might be an essential problem of ferroelectric materials, than destructive readout type memory cells with two transistors and two capacitors, or one transistor and one capacitor, and are also available for high-speed operations. Because these excellent properties are expected, MFS-FET ferroelectric non-volatile memories are now recognized as ultimate memories ((8) Appl. Surf. Sci. 113/114(1997)656).

What is preventing practical use of these MFS-FET ferroelectric non-volatile memories is problems with their manufacturing process. It is extremely difficult to grow ferroelectric materials directly on Si substrates. Therefore, growth of buffer layers of insulating materials on Si substrates is recognized as one of most important technologies. In case of a MFIS (metal-ferroelectrics-insulator-semiconductor)-FET which is one of MFS-FET ferroelectric non-volatile memories, gate voltage is distributed to an insulating layer as well, and this invites the drawback that the write voltage is high. To prevent it, the insulating layer must be one with a high dielectric constant. On the other hand, material properties required as a ferroelectric material used here are a low dielectric constant, appropriate value of residual polarization (typically around ~0.1 $\mu C/cm^2$, although depending upon the device design), and most seriously, good squareness ratio. Additionally, for the purpose of realizing a better interface, one of important conditions is that these materials can be grown at low temperatures. Thus, choice and development of materials is required from the standpoint different from that of the one-transistor and one-capacitor type. There are a lot of research reports on MFIS-FET ferroelectric non-volatile memories. However, because of insufficient interface properties, there is almost no reports about practically usable ones including the requirement for retention (charge retaining property).

On the other hand, it is greatly significant to introduce oxide materials other than $SiO_2$ into the semiconductor industry. High-temperature superconductive materials discovered in 1986 ((9) Z. Phys. B., 64, 189–193(1986)), needless to say, and oxide materials especially having perovskite or related structures have very important physical properties for semiconductor devices, such as ferroelectricity, high dielectric constant, superconductivity, colossal magnetoresistance, and so forth ((10) Mater. Sci. Eng., B41(1996)166, and (11) J. Ceram. Soc. Japan, Int. Ed., 103(1995)1088). For example, among ferroelectric materials of capacitors for ferroelectric non-volatile memories mentioned above, zirconium titanate (PZT) having a large value of spontaneous polarization and a low process temperature (for example, (12) J. Appl. Phys. 70, 382–388 (1991)) and bismuth strontium tantalate ($Bi_2SrTa_2O_9$ ((13) Nature, 374(1995)627, (14) Appl. Phys. Lett., 66(1995)221, (15) Mater. Sci. Eng., B32(1995)75, (16) Mater. Sci. Eng., B32(1995)83, (17) Appl. Phys. Lett., 67(1995)572, (18) J. Appl. Phys., 78(1995)5073, (19) Appl. Phys. Lett., 68(1996) 566, (20) Appl. Phys. Lett., 68(1996)690, and (21) International Laid-Open Publication WO93/12542) are the twin greatest materials. Furthermore, including the discovery of colossal magnetoresistance materials (CMR materials) in the group of Mn oxides, which are variable in resistivity over some digits under application of a magnetic field ((22) Phys. Rev. Lett. 74(1995)5108), great interest has come to be attracted to how high potential capacities these oxide materials have ((23) Mater. Sci. Eng., B41(1996)166, and (24) J. Ceram. Soc. Japan, Int. Ed., 103(1995)1088), and technologies for making thin oxide films have been developed remarkably in these ten years or so.

If oxide materials having these very high functional physical properties can be developed on Si which is the basis of the semiconductor industry, these materials will get a high marketability. However, because of difficulties between these functional oxide materials and Si, such as mutual thermal diffusion and differences in thermal expansion coefficient, it is usually difficult to directly grow these functional oxide materials on Si.

As discussed above, almost all of these functional oxide materials have structure based on a perovskite structure. Many of them, such as yttrium-system superconductive materials having critical temperatures beyond the liquid nitrogen temperature and $Bi_2SrTa_2O_9$ mentioned above, have structures called layered perovskite having a very large anisotropy. In these layered perovskite structured oxides, superconductive current paths, polarization axes, etc. are limited to specific directions, and also in case of simple perovskite structured oxides, there are many in which polarization axes are limited to specific directions like that in PZT. Therefore, when they are used to make devices, it is important to specifically orient oxides, or more preferably, epitaxially grow them relative to bases, in order to draw out their maximum properties.

Ceria (cerium dioxide: $CeO_2$) having a fluorite structure is one of candidates for materials of gate insulating films with high dielectric constants for the sub 0.1 micron generation to substitute for $SiO_2$ films by thermal oxidation because of its thermal stability, high specific dielectric constant ($\epsilon_r$ ~26) and very good lattice matching with Si substrates (misfit: about 0.35%), and it is considered to be one of most ideal buffer layer materials for epitaxially growing perovskite-related oxides on Si substrates. Actually, researches are being made on epitaxial growth of ceria on Si substrates, but most of them are directed to $CeO_2(111)/Si(111)$ structures easy for atomic close-packed growth (for example, (25) Jpn. J. Appl. Phys. 34(1995), L688, and (26) Japanese Patent Laid-Open Publication No. hei 7-25698). With regard to Si(001) substrates which permit a channel to be formed in the Si<110> orientation having the largest mobility and are being used exclusively as MOS-FET substrates, it has been believed that $CeO_2(110)$ having an antiphase domain epitaxially grows, reflecting the dimer structure by the surface reconstructed structure of Si(001)-2×1, 1×2. Further, regarding the growth temperature, it is considered that a temperature around 800° C. at which no $SiO_2$ film is formed on the Si surface in a high vacuum ((27) J. Vac. Sci. Technol. A13(1995)772) is the lower limit of epitaxial temperature ((28) Jpn. J. Appl. Phys. 33(1994), 5219, (29) Appl. Phys. Lett. 56 (1990), 1332, (30) Appl. Phys. Lett. 59(1991), 3604, (31) Physica C 192 (1992)154, (32) Jpn. J. Appl. Phys. 36(1997), 5253, and (33) Japanese Patent Laid-Open Publication No. hei 9-64206). Furthermore, under the belief that the growth temperature must be lowered to obtain a steep interface, electron beam assisted epitaxial growth, for example, is under trial. However, the lower limit of epitaxial growth temperature heretofore reported is 710° C. ((34) 1998 spring symposium of Oyo Butsuri Gakkai, Presentation No. 28p-PA-1).

Researches are being made also on yttria (yttrium oxide: $Y_2O_3$) having a C-rare-earth structure (bixbyite) because it has material properties similar to ceria. However, it involves the same problems as ceria, and in usual, $Y_2O_3(110)$ epitaxially grows on Si(001) substrates ((35) Appl. Phys. Lett. 71(1997), 903).

On the other hand, there is an example in which a perovskite oxide epitaxially grows on ceria (or yttria) (for example, (36) Appl. Phys. Lett. 68(1996)553). Therefore, if ceria can be controlled in orientation, a device making use of the characteristics of functional oxides will be realized. Although $CeO_2(110)/Si(001)$ is not always the most desirable growth orientation, it is possible that $CeO_2(110)/Si(001)$ structure is acceptable or rather desirable, depending on the anisotropy of a functional oxide to be epitaxially grown thereon and a device design required.

Under these circumstances, technologies for epitaxially growing $CeO_2(110)$, which is one of important orientations, on Si(001) substrates most important for practical application at a temperature lower than 710° C. which is the lowest temperature heretofore reported.

OBJECTS AND SUMMARY OF THE INVENTION

It is therefore an object of the invention to provide a crystal growth method of oxides capable of epitaxially growing cerium oxide, yttrium oxide, and rare earth oxides having crystal structures similar to them in the (110) orientation on (001)-oriented silicon substrates at a growth temperature lower than conventional ones to realize an epitaxial rare earth oxide (110)/silicon (001) structure; and a multi-layered structure of oxides.

The Inventors made researches toward resolution of the above-discussed problems involved in the conventional technologies. Their outline is explained below. In the explanation made below, growth of cerium oxide is taken as a typical example.

To attain the object of the invention, it is important that the surface of a silicon substrate has steps and terraces at least once. This can be realized by the method proposed by Ishizaka and Shiraki et al ((37) J. Electrochem. Soc., 133 (1986)666), for example, or other similar methods. The growth apparatus is preferably one of molecular beam epitaxy (MBE) apparatus, laser ablation apparatus, reactive vacuum evaporation apparatus, and so forth, excellent in surface controllability and permitting observation of the surface by reflection high energy electron diffraction (RHEED). Basically, however, any apparatus is acceptable provided it can control the pressure, temperature, and so on. When growing cerium dioxide ($CeO_2$), cerium dioxide itself is used as the source material of cerium in most cases. However, since oxygen with a low vapor pressure, selectively volatilizes, it is desirable to use cerium metal in order to control a low oxygen partial pressure. But oxide source materials are considered usable if the low vacuum can be maintained by additionally using a getter pump, for example for evacuation of the growth chamber, for example. Cerium metal has a high melting point and a low vapor pressure, and it is desirable to vaporize it by using a high-temperature Knudsen cell, electron beam vapor deposition, excimer laser, or the like. Additionally, for controlling interaction of these gases or metal elements, etc. with the highly active surface of the silicon substrate, it is important to employ a low-temperature process.

The Inventors made researches on conditions for epitaxial growth of $CeO_2(110)$ on silicon (001) substrates from various standpoints, including a decrease of the growth temperature to control rates of generating cerium silicide, silicon oxide, for example. In conclusion, it is essentially important to prepare the surface of the silicon (001) substrate in form of a dimer structure of 2×1 and 1×2 surface reconstruction before the growth, and it is also important how the source material is supplied during the growth. Regarding the latter subject, method of supply the source material, it is important, more specifically, to first start the supply of oxidic gas like oxygen onto the silicon (001) substrate surface and subsequently start the supply of the source material of Ce. Its reason has not been clarified yet. However, it is presumed that the surface of the silicon (001) substrate is covered by molecules or atoms of oxidic gas like oxygen before the supply of the source material of Ce is started, and this promotes (110) epitaxial growth of $CeO_2$.

In addition to the above-mentioned matters, for epitaxial growth of $CeO_2(110)$, it is important to appropriately select the ratio of the supply amount of oxidic gas relative to the supply amount of the source material of Ce under a certain growth temperature, or the partial pressure of the oxidic gas or its supply amount when the supply amount of the source material of Ce is constant. FIG. 1 shows relationship between growth temperature T and ratio O/Ce of the supply amount of oxidic gas relative to the supply amount of the source material of Ce when the latter is constant. For convenience, shown on the ordinate of FIG. 1 are values of $O_2$ flow rate [sccm] instead of O/Ce. It is known from FIG. 1 that there is a certain restriction in the region where $CeO_2(110)$ can epitaxially grow. Also known therefrom is that, as the general tendency, the $O_2$ flow amount has to be increased as the growth temperature increases.

The Inventors reached the present invention after making investigation from various viewpoints, in addition to the above-explained researches and knowledge.

According to the first aspect of the invention, there is provided a crystal growth method of an oxide comprising the steps of:

processing a surface of a (001)-oriented silicon substrate into a dimer structure by 2×1 and 1×2 surface reconstruction; and epitaxially growing a rare earth oxide of a cubic system or a tetragonal system in the (110) orientation on the silicon substrate in an atmosphere containing an oxidic gas by using a source material made up of at least one kind of rare earth element.

According to the second aspect of the invention, there is provided a crystal growth method of an oxide comprising the steps of:

processing a surface of a (001)-oriented silicon substrate into a dimer structure by 2×1, 1×2 surface reconstruction; and epitaxially growing a rare earth oxide of a cubic system or tetragonal system in the (110) orientation on the silicon substrate by using a source material containing at least one kind of rare earth element in an atmosphere containing an oxidic gas, when the rare earth oxide is epitaxially grown, the source material containing at least one kind of rare earth element being supplied after the supply of the oxidic gas onto the surface of the silicon substrate is started.

According to the third aspect of the invention, there is provided a crystal growth method of an oxide comprising the steps of:

processing a surface of a (001)-oriented silicon substrate into a dimer structure by 2×1, 1×2 surface reconstruction; and epitaxially growing a rare earth oxide of a cubic system or tetragonal system in the (110) orientation on the silicon substrate at a growth temperature lower than 710° C.

In the third aspect of the invention, the rare earth oxide is epitaxially grown typically at a growth temperature lower than 300° C. and preferably at a growth temperature not higher than 100° C.

According to the fourth aspect of the invention, there is provided a multi-layered structure of oxides comprising:

a (001)-oriented silicon substrate;

a $CeO_2$ film grown on the silicon substrate at a first growth temperature; and a (110)-oriented $CeO_2$ film epitaxially grown on the $CeO_2$ film at a second growth temperature higher than the first growth temperature.

According to the fifth aspect of the invention, there is provided a multi-layered structure of oxides comprising:

a (001)-oriented silicon substrate;

a $SiO_x$ film on the silicon substrate;

a $CeO_2$ film grown on the $SiO_x$ film at a first growth temperature; and a (110)-oriented $CeO_2$ film epitaxially grown on the $CeO_2$ film at a second growth temperature higher than the first growth temperature.

In the fifth aspect of the invention, x of the $SiO_x$ film is typically in the range of $0<x \leq 3$ and normally in the range of $1 \leq x \leq 2$.

In the fourth and fifth aspects of the invention, the first growth temperature may be selected arbitrarily in the range of the room temperature to 700° C., for example.

Oxides multi-layered structures according to the fourth and fifth aspects of the invention can be illustrated as shown in FIGS. 2 and 3, respectively.

In the present invention, the (001)-oriented silicon substrate intends to involve a silicon substrate offset from the (001) orientation within a range which can be regarded to be substantially equivalent to the (001) orientation.

In the present invention, the rare earth oxide is any one of oxides of rare earth elements like cerium (Ce), yttrium (Y), and so forth, and may be an oxide of one kind of rare earth elements, or two or more kinds of rare earth elements. When the rare earth oxide is expressed as $ReO_z$ (where Re is one or more rare earth elements), $0<z \leq 3$ is normally satisfied. Although the rare earth oxide is a cubic system or a tetragonal system, the cubic or tetragonal system includes those slightly distorted within a range which can be regarded as the cubic or tetragonal system substantially. The rare earth oxide typically takes a fluorite structure ($CeO_2$ structure) or a C-rare-earth structure ($Y_2O_3$ structure; bixbyite structure).

In the present invention, for the purpose of epitaxially growing the rare earth oxide in the (110) orientation more reliably, a source material containing at least one kind of rare earth element is supplied preferably after the oxidic gas is supplied onto the surface of the silicon substrate in the process of epitaxial growth of the rare earth oxide. The source material containing at least one kind of rare earth element may be either one made up of at least one kind of rare earth element or one made up of a rare earth oxide, for example. However, especially at high temperatures around 700° C., since surface oxidation will start at the moment of the supply of the oxidic gas onto the substrate surface, also the supply of the rare earth element has to be started immediately. In appropriate cases, a very small amount of rare earth elements, e.g. in the order of EL monolayer or sub mono layer, may exists on the surface of the silicon substrate before the supply of the oxidic gas as it invites no trouble.

In the present invention, a further step of annealing may be provided to anneal the rare earth oxide in vacuum of a pressure not higher than $1\times10^{-6}$ Torr at a temperature not lower than the growth temperature of the rare earth oxide after epitaxially growing the rare earth oxide. After the rare earth oxide is epitaxially grown, another step of homoepitaxially growing a rare earth oxide on the former rare earth oxide at a growth temperature higher than that of the former rare earth oxide may be provided. After the rare earth oxide is epitaxially grown, another step of epitaxially growing a functional oxide on the rare earth oxide may be provided.

In the present invention, depending upon the growth conditions, a silicon oxide film or defective layer not thicker than 5 nm may be formed along the interface between the silicon substrate and the rare earth oxide after growth of the rare earth oxide.

In the present invention, the functional oxide typically has a perovskite structure or a layered perovskite structure. Essentially, any can be the functional oxide, such as, for example, ferroelectric material, superconductive material, pyroelectric material and piezoelectric material.

In the present invention, the (110)-oriented rare earth oxide by epitaxial growth is used as, for example, a gate insulating film of MIS-FET or a device separating insulating film, and can be used as a buffer layer as well when it is difficult to grow a functional oxide directly on a silicon substrate.

According to the invention having the above-summarized structure, by processing the surface of a (001)-oriented silicon substrate into a dimer structure by 2×1, 1×2 surface reconstruction and preferably supplying a source material containing at least one kind of rare earth element after starting the supply of an oxidic gas onto the surface of the silicon substrate in the process of epitaxial growth of a rare earth oxide, the rare earth oxide can be epitaxially grown excellently in the (110) orientation on the (001) oriented silicon substrate at a growth temperature lower than conventional ones.

The above, and other, objects, features and advantage of the present invention will become readily apparent from the following detailed description thereof which is to be read in connection with the accompanying drawings.

BRIEF DESCRIPTION OF THE DRAWINGS

FIG. 9 is a diagram showing a RHEED pattern of a (110) $CeO_2$ film grown in the second embodiment of the invention;

DETAILED DESCRIPTION OF THE PREFERRED EMBODIMENTS

Figure 1:
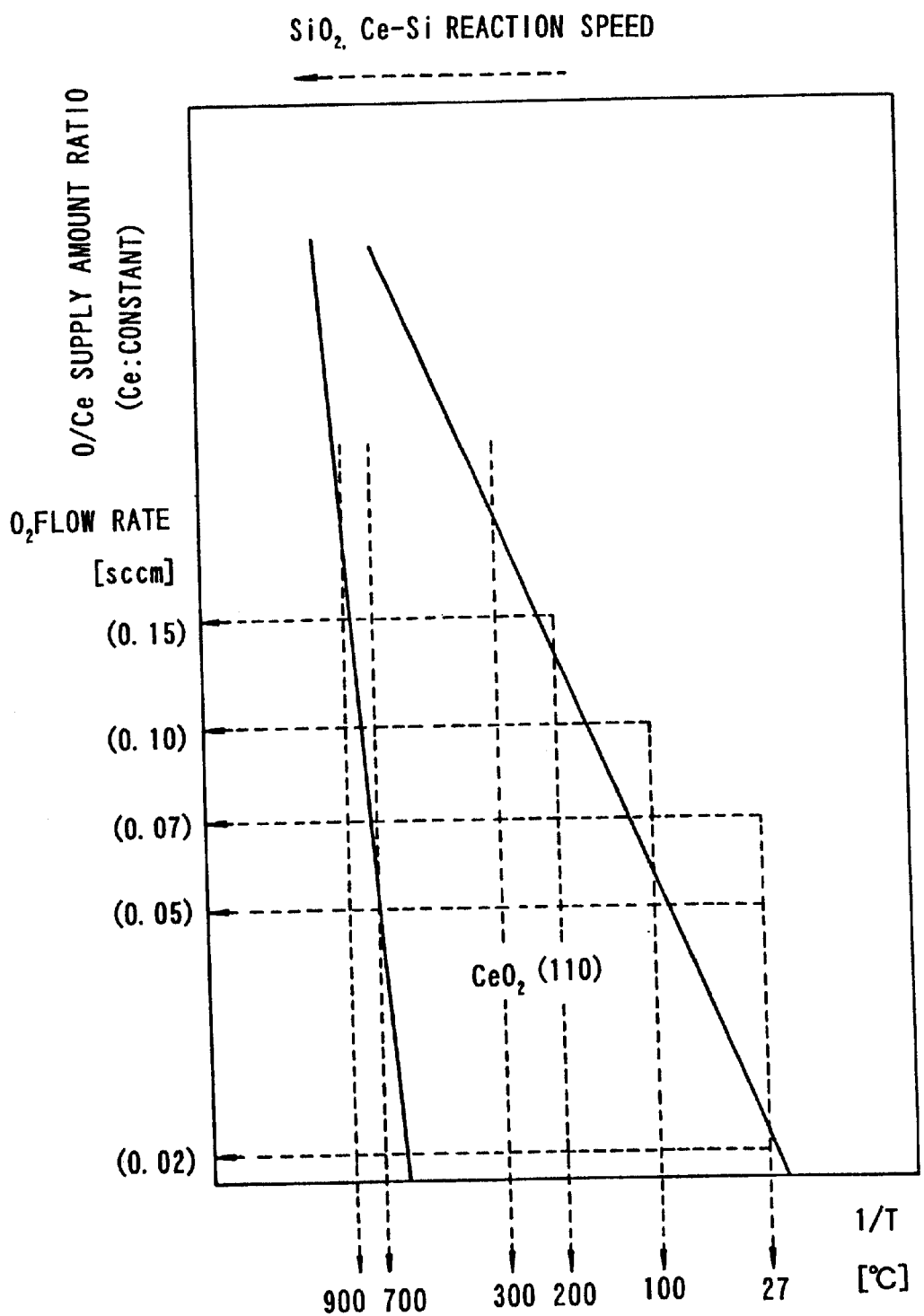
FIG. 1 is a diagram for explaining relationship between crystal orientations obtained when growing $CeO_2$ on a (001) Si substrate and growth conditions.
Figure 2:
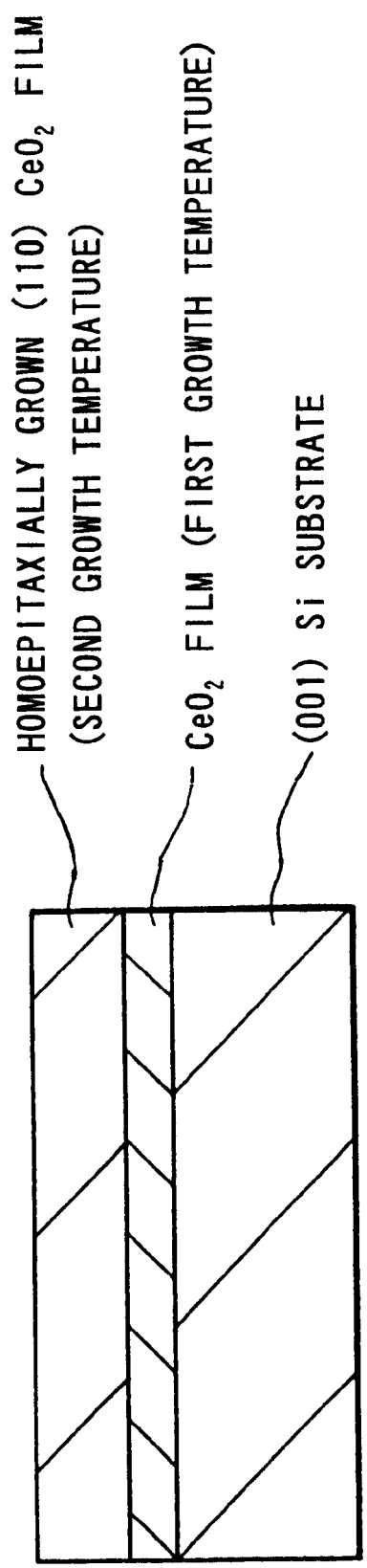
FIG. 2 is a diagram showing an example of epitaxial structure formed on a (001) Si substrate.
Figure 3:
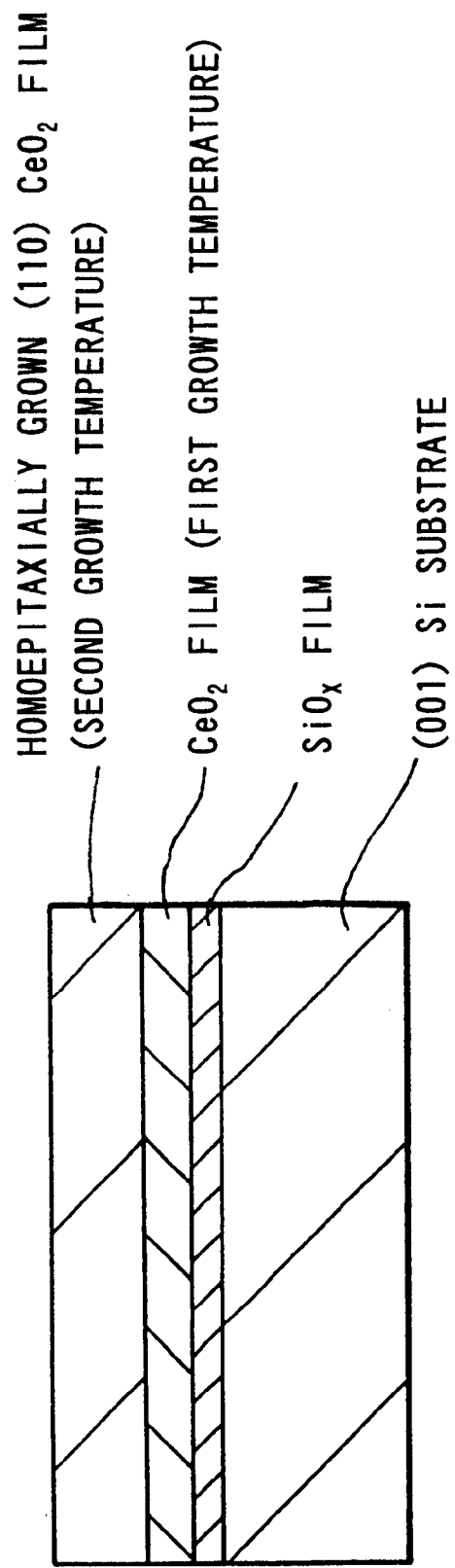
FIG. 3 is a diagram showing an example of epitaxial structure formed on a (001) Si substrate.

Explained below are embodiments of the invention with reference to the (drawings. In all of the drawings illustrating embodiments, the same or equivalent parts are labeled with common reference numerals.

First explained is a MBE apparatus used for growing $CeO_2$ in the embodiments explained below. Although it is not impossible to use here a MBE apparatus designed for growth of typical +semiconductors, it is preferable that a nozzle, pipe and other members are provided to enable introduction of oxygen gas into the growth chamber, and the growth chamber, heater, cell and other members must be made of materials resistant to oxidation. Additionally, high-energy electron beams can be directed at an angle within several degrees relative to the substrate surface to enable the surface condition of the substrate to be monitored and a screen coated by a fluorescent material is provided so that the electron beam diffraction image can be observed (RHEED system). The substrate susceptor is made of silicon carbide (SiC) to be heated from the bottom surface by a SiC heater. Three Knudsen cells for generation of molecular beams and two electron beam (EB) guns for electron beam evaporation are provided for the purpose of supplying the source materials. An oxidic gas is supplied to the proximity of the substrate by a nozzle and blown onto the substrate after a flow control by a mass flow controller.

A crystal growth method of an oxide according to the first embodiment of the invention is explained below.

Figure 4A:
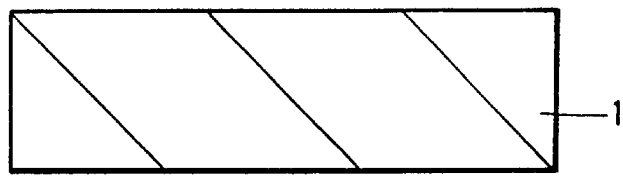
FIGS. 4A through 4C are cross-sectional views for explaining a crystal growth method of an oxide according to the first embodiment of the invention.

In the first embodiment, first prepared is a (001) oriented Si substrate 1 as shown in FIG. 4A.

Figure 4B:
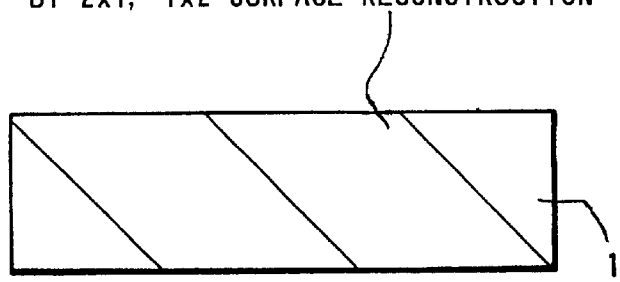

The (001) Si substrate 1 next undergoes surface treatment. This surface treatment is conducted by using the above-introduced method proposed by Ishizaka, Shiraki et al. or other equivalent method so as to form a volatile $SiO_2$ film on the surface and expose the surface by annealing. More specifically, by conducting RCA cleaning of the Si substrate 1 and then repeating several times treatment thereof in concentrated nitric acid boiled to 120 through 130° C. for 10 minutes (etching of the substrate surface and formation of the $SiO_2$ film) and treatment thereof by 2.5% dilute hydrofluoric acid for approximately 10 through 15 seconds (removal of the $SiO_2$ film) to thereby form an even surface. After that, by introducing it into aqueous perammonia ($NH_4OH:H_2O_2:H_2O=1:1:3$) heated to 90° C., a thin $SiO_2$ film is formed on the surface of the Si substrate 1 (for 10 minutes), and it is processed for about 10 to 15 seconds by 2.5% dilute hydrofluoric acid (removal of the $SiO_2$ film). Then, it is introduced again into aqueous perammonia ($NH_4OH:H_2O_2:H_2O=1:1.25:3$) heated to 90° C. to form a thin $SiO_2$ film (for 10 minutes), then rinsed with ultrapure water having a specific resistance not less than 18 MΩcm, followed by removal of water drops from the substrate surface by nitrogen gas, and thereafter introduced into the growth chamber of the MBE apparatus. In the growth chamber, after it is degassed in vacuum at 600° C. for one hour, it is heated to 1000° C. and held at the temperature for several seconds to vaporize SiO from the surface of the Si substrate 1 ($Si+SiO_2 \rightarrow 2SiO\uparrow$). In this process, at the moment where it is heated to about 850° C., the 2×1, 1×2 reconstructed surface is obtained (FIG. 4B). The Si substrate 1 having formed the dimer structure by 2×1, 1×2 surface reconstruction is cooled to the growth temperature and used as the substrate for growth of $CeO_2$. By adequately controlling the process conditions, a (110)$CeO_2$ film can be epitaxially grown in a wide range of temperatures from 700° C. to the room temperature.

Figure 4C:
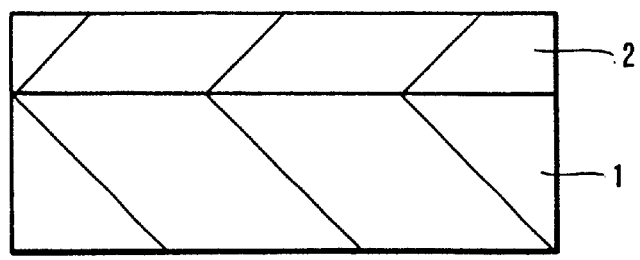
Figure 5:
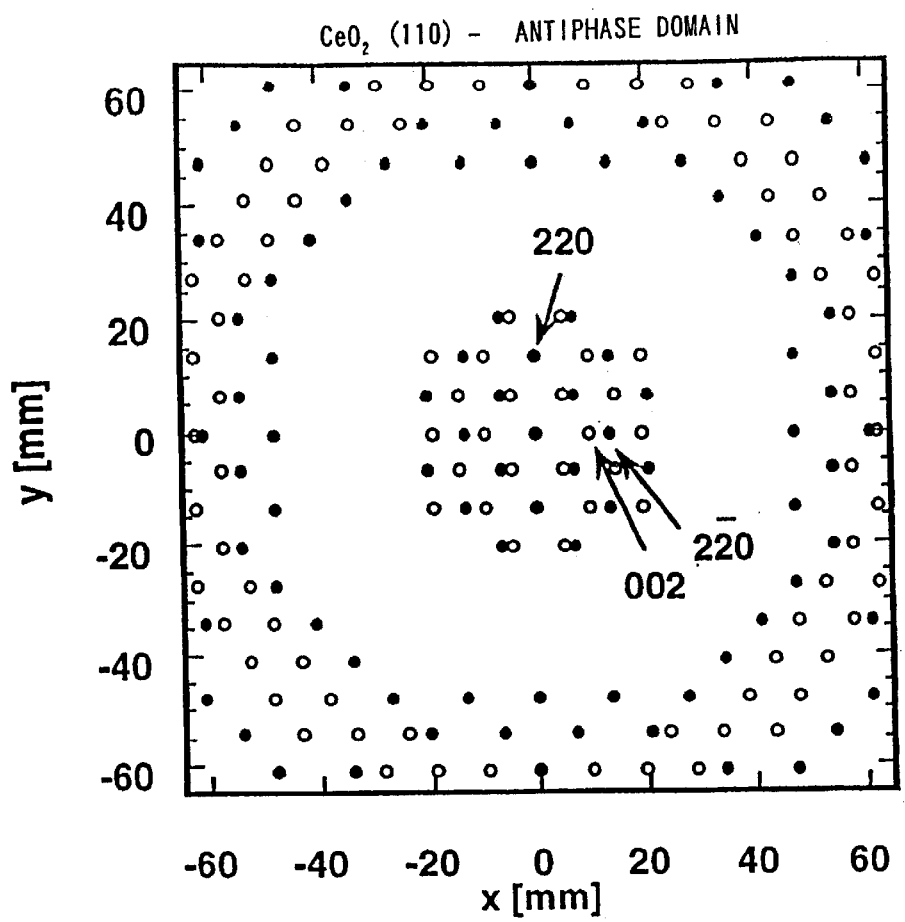
FIG. 5 is a diagram showing a simulation pattern of positions of electron beam diffraction by <001> and <1–10> incidence of a (110) $CeO_2$ film grown in the first embodiment of the invention.
Figure 6:
FIG. 6 is a diagram showing a RHEED pattern actually obtained by <001> and <1–10> incidence of a (110) $CeO_2$ film grown in the first embodiment of the invention.

After that, as shown in FIG. 4C, by using cerium metal and oxygen as source materials and supplying them at appropriate rates (see FIG. 1) onto the Si substrate 1 having formed the dimer structure by 2×1, 1×2 surface reconstruction at the growth temperature of 300° C., the (110)-oriented $CeO_2$ film 2 is epitaxially grown. More specifically, setting the EB gun current to 150 mA and the flow rate of oxygen to 0.05 sccm, cerium metal and oxygen are supplied into the growth chamber. What is important here is to supply cerium metal after starting the supply of oxygen onto the surface of the Si substrate 1. During this growth, the Si substrate is so positioned that the tip end of the oxygen gas supply nozzle points the center of the Si substrate 1. When the growth is conducted in this manner, it is confirmed on a RHEED screen that $CeO_2$ (110) is epitaxially growing. FIGS. 5 and 6 show a simulation pattern of positions of electron beam diffraction by <001> and <1-10> incidence of the (001) $CeO_2$ film and a RHEED pattern actually obtained.

Figure 7:
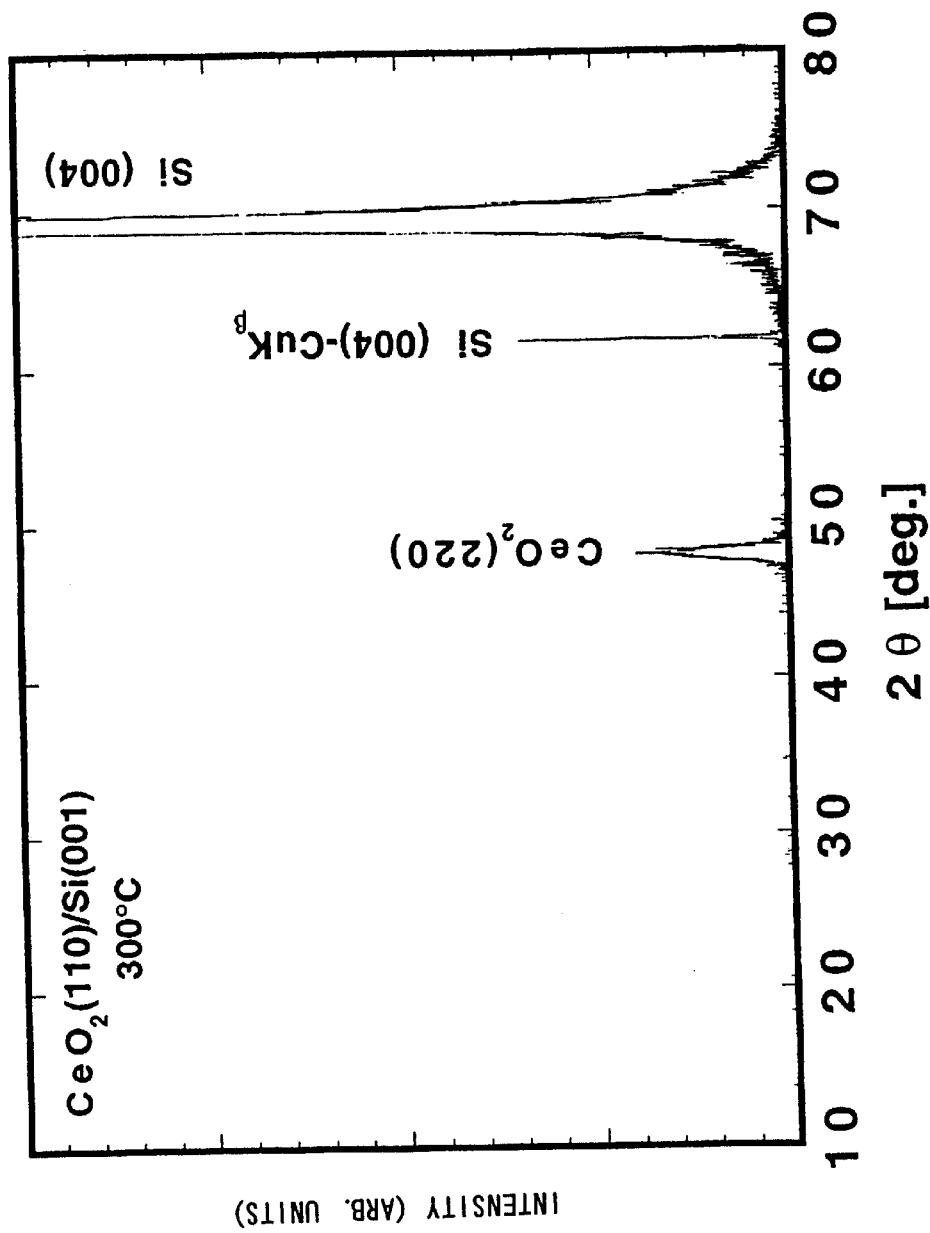
FIG. 7 is a diagram showing an X-ray diffraction pattern of a (110) $CeO_2$ film grown in the first embodiment of the invention.
Figure 8:
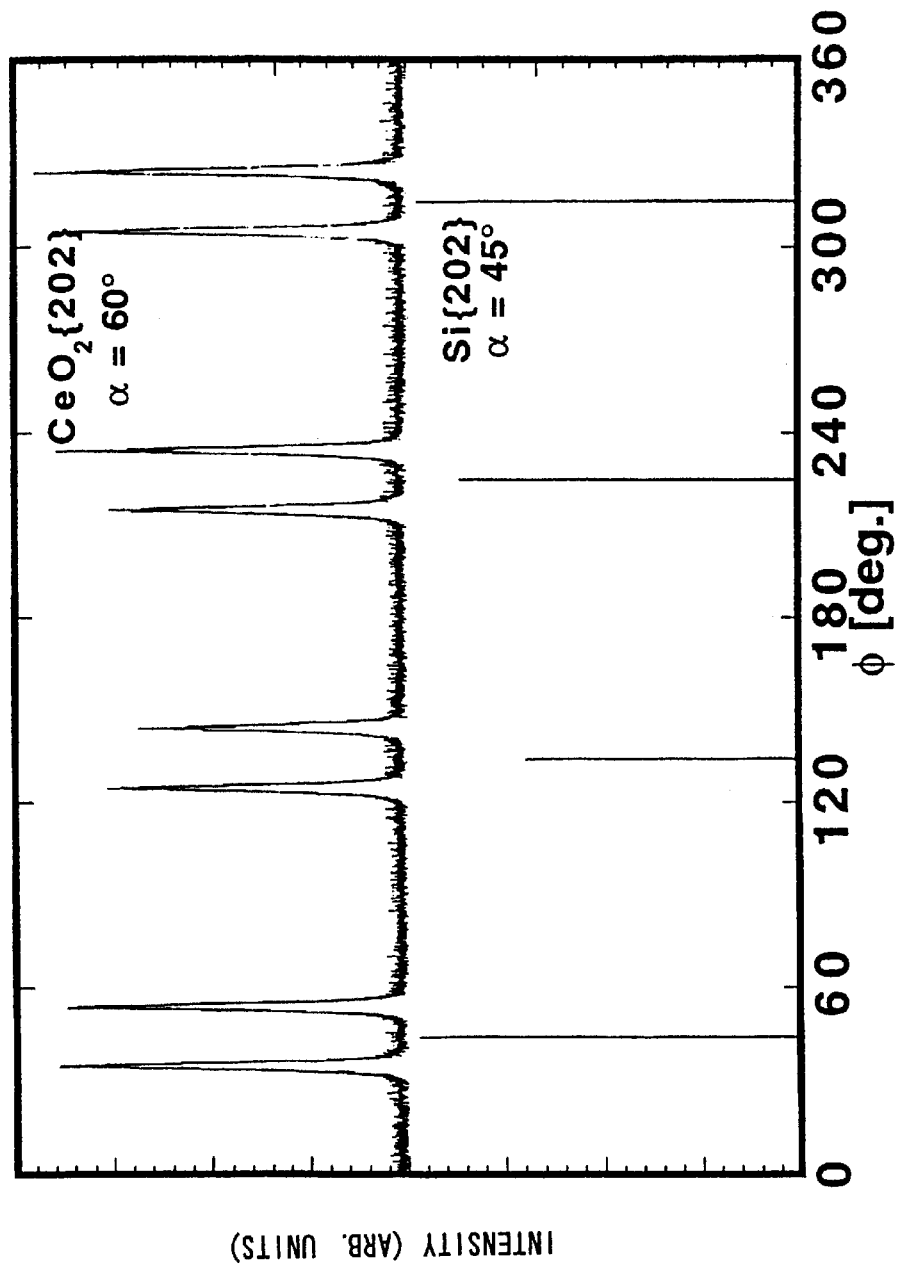
FIG. 8 is a diagram showing φ scan data of $CeO_2$ {202} and substrate Si {202} peak of a sample which includes a (110) $CeO_2$ film grown in the first embodiment of the invention.

FIG. 7 shows a result of measurement of X-ray diffraction pattern by θ/2θ scan of the (110)$CeO_2$ film. The diffractometer used has the measuring axes for inclination α and rotation within the plane β in addition to θ/2θ, and axial set-up, φ-scan measurement, and so forth, can be conducted. The X-ray source is the CuK α ray. In this case, the axial set-up was done to maximize the intensity of symmetric reflection of Si(004), and the crystal was evaluated. Since this (110)$CeO_2$ film is relatively thin (~15 nm), diffraction is not strong, but the $CeO_2$(220) peak is observed. FIG. 8 shows φ-scan data of $CeO_2${202} and substrate Si{202} peak of this sample. It is known from FIG. 8 that two pairs of diffraction peaks with a 2-fold symmetry exist in the $CeO_2${202} data, and it is confirmed that (110)$CeO_2$ having an antiphase domain was epitaxially grown or Si (001) substrate. Consequently, it has been confirmed that a (110) $CeO_2$ epitaxial film can be obtained at any arbitrary temperature from 300° C. to 700° C., approximately, by appropriately supplying cerium and oxidic gas.

As explained above, according to the first embodiment, since the surface of the (001) Si substrate 1 is first processed into a dimer structure by 2×1, 1×2 surface reconstruction, cerium metal and oxygen are thereafter supplied to the growth chamber at appropriate rates, by starting the supply of oxygen earlier, and thereby progressing growth, the $CeO_2$ film 2 can be epitaxially grown well in the (110) orientation at a growth temperature in the range from 300° C. to 700° C., approximately, which is lower than conventional ones.

Next explained is a crystal growth method of an oxide according to the second embodiment of the invention.

In the second embodiment, the (110)$CeO_2$ film 2 is epitaxially grown on the (110) Si substrate 1 having formed a dimer structure by 2×1, 1×2 surface reconstruction on the surface. In this growth, the growth temperature is set to the room temperature, and the Si substrate 1 is positioned slightly apart from the tip end of the oxygen gas supply nozzle. This is for convenience from the standpoint of the apparatus although growth of the same level will be possible even by reducing the oxygen supply amount. In the other respects, the second embodiment is the same as the first embodiment.

FIG. 9 shows a RHEED pattern by <001> and <1-10> incidence of the $CeO_2$ film 2 obtained here. It is known from FIG. 9 that an epitaxial (110)$CeO_2$ film 2 was obtained. This means that an epitaxial (110)$CeO_2$ film can be obtained even at the room temperature by making a slight shortage of the oxygen supply amount and increasing the Ce/O supply ratio.

As explained above, according to the second embodiment, it is possible to epitaxially grow the $CeO_2$ film 2 well in the (110) orientation even at the room temperature lower than conventional growth temperature by as much as 700° C.

Next explained is a crystal growth method of an oxide according to the third embodiment of the invention.

Figure 10A:
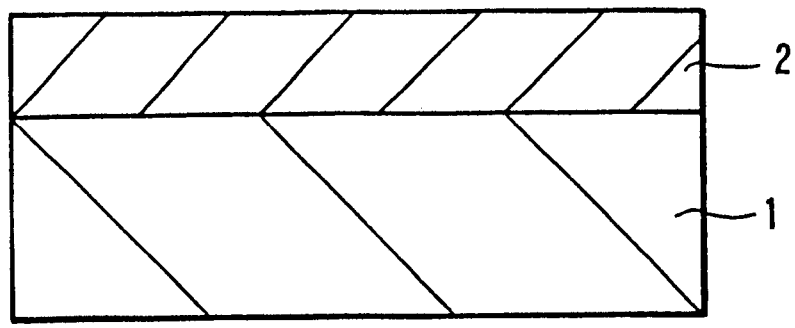
FIGS. 10A and 10B are cross-sectional views for explaining a crystal growth method of an oxide according to the third embodiment of the invention.

In the third embodiment, the (110)$CeO_2$ film 2 is epitaxially grown on the (001)Si substrate 1 at the room temperature in the same mariner as the first embodiment, as shown in FIG. 10A.

Figure 10B:
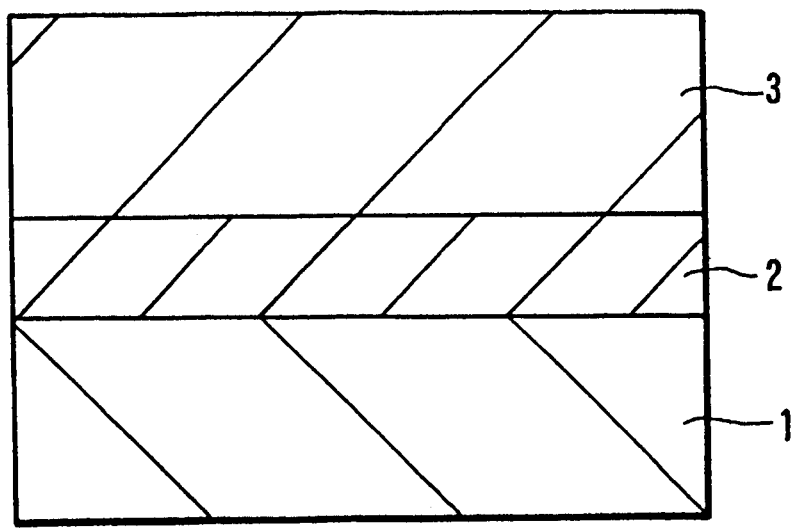

After that, the growth temperature is raised to 700° C. in vacuum, and as shown in FIG. 10B, at the growth temperature of 700° C. under the same source material supply conditions as the second embodiment, a $CeO_2$ film 3 is homoepitaxially grown in the (110) orientation on the (110) $CeO_2$ film 2. In this case, position of the Si substrate 1 is slightly distant from the tip end of the oxygen gas supply nozzle in the same manner as the second embodiment.

Figure 11:
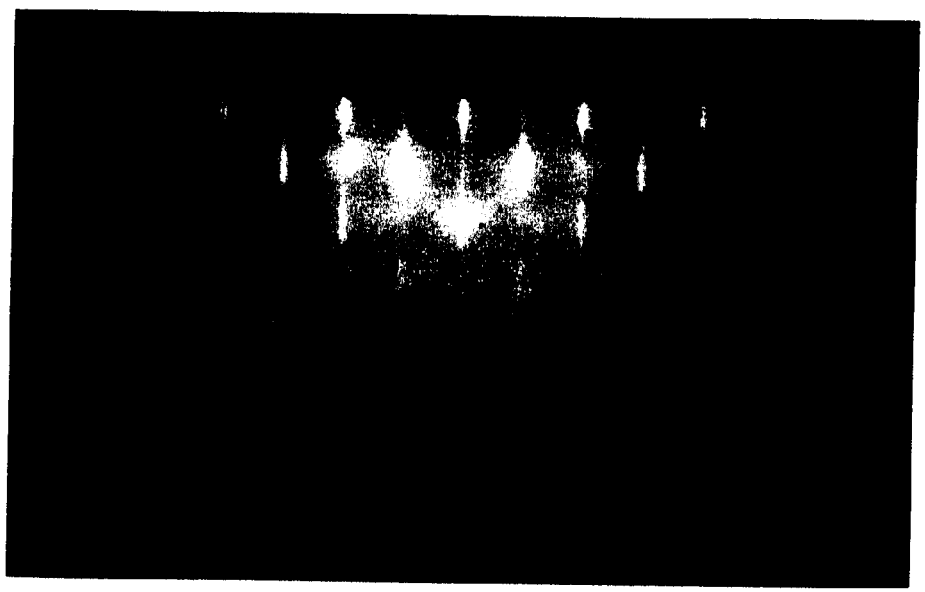
FIG. 11 is a RHEED pattern obtained by <001> and <1–10> incidence of a (110) ($CeO_2$ film homoepitaxially grown in the third embodiment of the invention.
Figure 12:
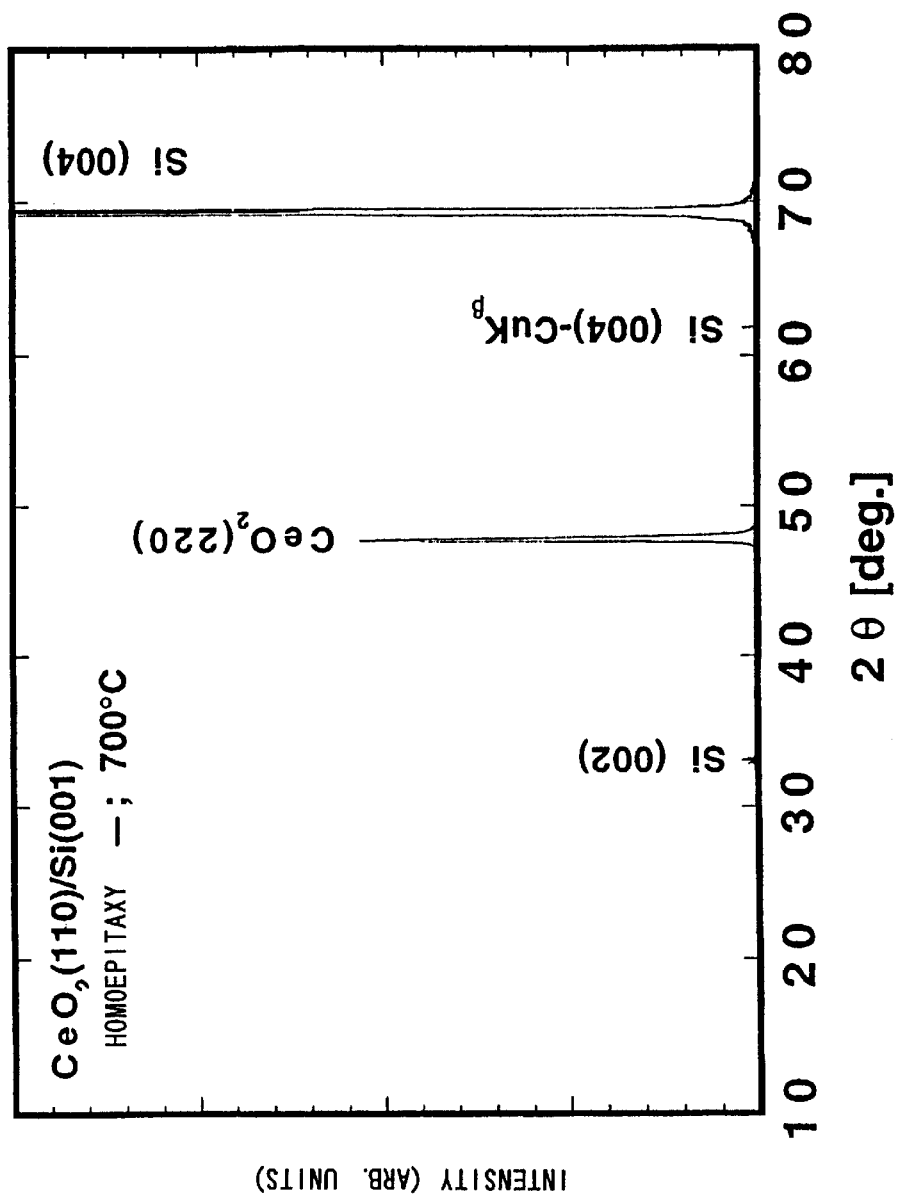
FIG. 12 is an X-ray diffraction pattern of a (110) $CeO_2$ film homoepitaxially grown in the third embodiment of the invention.
Figure 13:
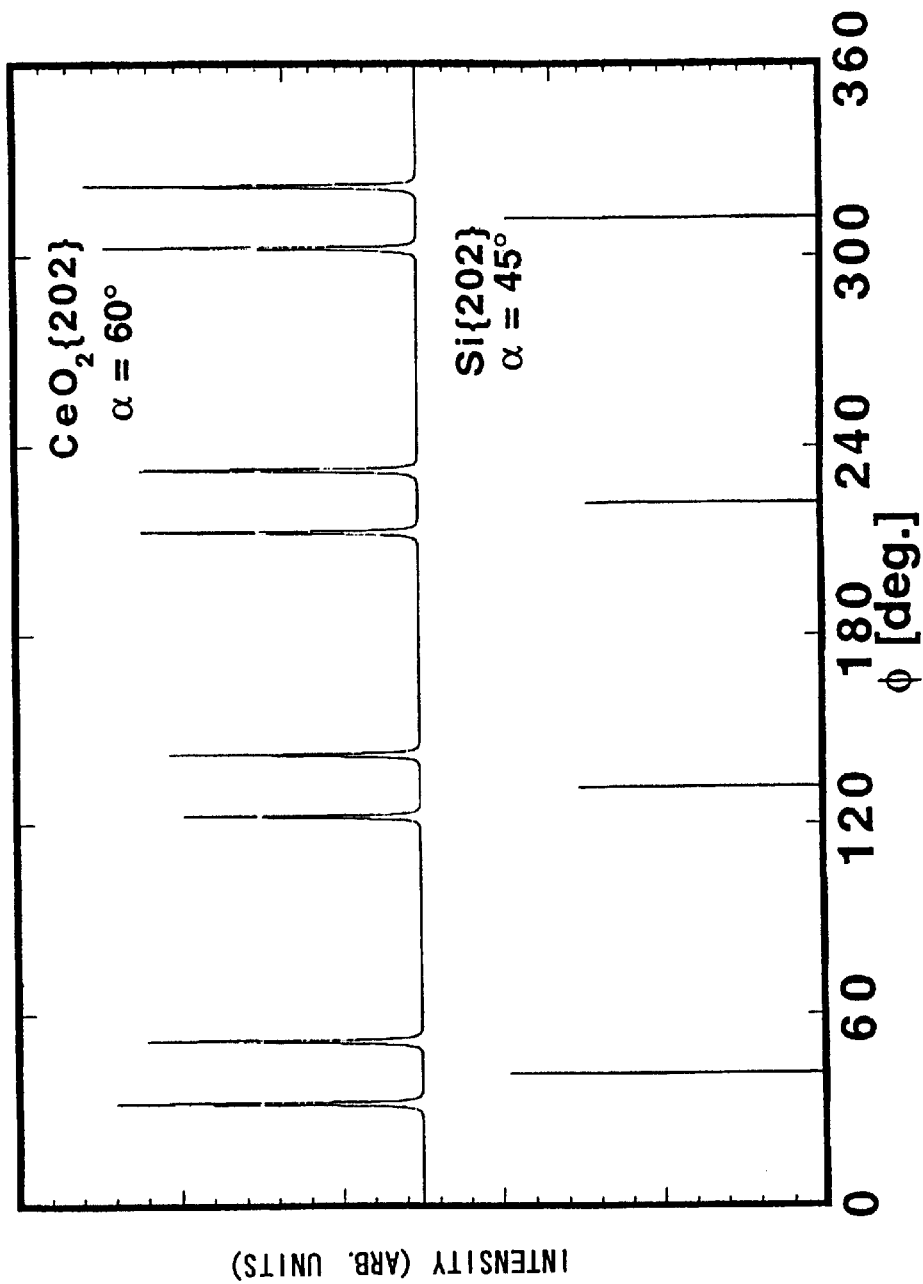
FIG. 13 is a diagram showing φ scan data of $CeO_2$ {202} and substrate Si {202} peak of a sample which includes a (110) $CeO_2$ film homoepitaxially grown in the third embodiment of the invention.

FIG. 11 shows a RHEED pattern by <001> and <1-10> incidence of the homoepitaxially grown $CeO_2$ film 3. It is confirmed from FIG. 11 that a (110)$CeO_2$ film 3 having a good crystal property was homoepitaxially grown on the (110)$CeO_2$ film 2 grown at the room temperature. This evidences that, although the (110)$CeO_2$ film 2 was grown at the room temperature, it is stable enough to permit homoepitaxial growth thereon at a high temperature and that its reliability as a substrate for heteroepitaxial growth of a functional oxide is ensured. FIG. 12 shows a result of measurement of an X-ray diffraction pattern by θ/2θ scan of the $CeO_2$ film of the (110)$CeO_2$ film 3. From FIG. 12, the $CeO_2$(220) peak alone was observed other than diffraction of the Si substrate, and epitaxial growth of $CeO_2$(110) was confirmed also by X-ray diffraction. φ-scan data of $CeO_2${202} and substrate Si{202} peak are shown in FIG. 13. It is confirmed from FIG. 13 that, like those of FIG. 8, there are two pairs of diffraction peaks with a 2-fold symmetry exist in the $CeO_2${202} data, and (110)$CeO_2$ having an antiphase domain was epitaxially grown.

As explained above, according to the third embodiment, since the $CeO_2$ film 3 is homoepitaxially grown in the (110) orientation on the $CeO_2$ film 2 after the (110)$CeO_2$ film 2 is grown on the (001)Si substrate 1 at the room temperature in the same manner as the second embodiment, the (110)$CeO_2$ film 3 having a sufficient thickness can be epitaxially grown with a good quality at the growth temperature as low as 700° C. lower than the conventional growth temperatures.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For example, during the growth of the (110) $CeO_2$ film 2, the first embodiment employs the method proposed by Ishizaka, Shiraki, et al. for surface treatment of the Si substrate 1. However, this is not indispensable.

Further, although the third embodiment sets the homoepitaxial growth temperature of the $CeO_2$ film 3 at 700° C., any lower growth temperature not lower than the growth temperature of the $CeO_2$ film 2 is also acceptable.

As described above, according to the invention, it is possible to epitaxially grow rare-earth oxides like cerium dioxide in the (110) orientation on a (001)-oriented silicon substrate at a growth temperature lower than conventional ones and thereby realize an epitaxial rare-earth oxide (110)/silicon (001) structure.

What is claimed is:

1. A crystal growth method of an oxide comprising the steps of:
   processing a surface of a (001)-oriented silicon substrate into a dimer structure by 2×1 and 1×2 surface reconstruction; and
   epitaxially growing a rare earth oxide of a cubic system or a tetragonal system in the (110) orientation on said silicon substrate in an atmosphere containing an oxidic gas by using a source material made up of at least one kind of rare earth element.

2. The crystal growth method according to claim 1 wherein, when said rare earth oxide is epitaxially grown, said source material containing at least one kind of rare earth element is supplied after the supply of said oxidic gas onto the surface of said silicon substrate is started.

3. The crystal growth method of an oxide according to claim 1 further comprising the step of annealing said rare earth oxide in vacuum with a pressure not higher than $1\times10^{-6}$ Torr at a temperature not lower than the growth temperature of said rare earth oxide after said rare earth oxide is epitaxially grown.

4. The crystal growth method of an oxide according to claim 1 further comprising the step of homoepitaxially growing another rare earth oxide on said rare earth oxide at a growth temperature higher than the growth temperature of said rare earth oxide after said rare earth oxide is epitaxially grown.

5. The crystal growth method of an oxide according to claim 1 further comprising the step of epitaxially growing a functional oxide on said rare earth oxide after said rare earth oxide is epitaxially grown.

6. The crystal growth method of an oxide according to claim 1 wherein a silicon oxide film or a defective layer not thicker than 5 nm is formed along the interface between said silicon substrate and said rare earth oxide.

7. The crystal growth method of an oxide according to claim 1 wherein said functional oxide has a perovskite structure or a layered perovskite structure.

8. The crystal growth method of an oxide according to claim 1 wherein said rare earth oxide is cerium dioxide or yttrium oxide.

9. A crystal growth method of an oxide comprising the steps of:
   processing a surface of a (001)-oriented silicon substrate into a dimer structure by 2×1, 1×2 surface reconstruction; and
   epitaxially growing a rare earth oxide of a cubic system or tetragonal system in the (110) orientation on said silicon substrate by using a source material containing at least one kind of rare earth element in an atmosphere containing an oxidic gas,
   when said rare earth oxide is epitaxially grown, said source material containing at least one kind of rare earth element being supplied after the supply of said oxidic gas onto the surface of said silicon substrate is started.

10. The crystal growth method of an oxide according to claim 9 wherein said source material containing at least one kind of rare earth element is made up of a rare earth oxide.

11. The crystal growth method of an oxide according to claim 9 further comprising the step of annealing said rare earth oxide in vacuum with a pressure not higher than $1\times10^{-6}$ Torr at a temperature not lower than the growth temperature of said rare earth oxide after said rare earth oxide is epitaxially grown.

12. The crystal growth method of an oxide according to claim 9 further comprising the step of homoepitaxially growing another rare earth oxide on said rare earth oxide at a growth temperature higher than the growth temperature of said rare earth oxide after said rare earth oxide is epitaxially grown.

13. The crystal growth method of an oxide according to claim 9 further comprising the step of epitaxially growing a functional oxide on said rare earth oxide after said rare earth oxide is epitaxially grown.

14. The crystal growth method of an oxide according to claim 9 wherein a silicon oxide film or a defective layer not thicker than 5 nm is formed along the interface between said silicon substrate and said rare earth oxide.

15. The crystal growth method of an oxide according to claim 9 wherein said functional oxide has a perovskite structure or a layered perovskite structure.

16. The crystal growth method of an oxide according to claim 9 wherein said rare earth oxide is cerium dioxide or yttrium oxide.

17. A crystal growth method of an oxide comprising the steps of:
   processing a surface of a (001)-oriented silicon substrate into a dimer structure by 2×1, 1×2 surface reconstruction; and
   epitaxially growing a rare earth oxide of a cubic system or tetragonal system in the (110) orientation on said silicon substrate at a growth temperature lower than 710° C.

18. The crystal growth method of an oxide according to claim 17 wherein said rare earth oxide is epitaxially grown in an atmosphere containing an oxidic gas by using a source material made up of at least one kind of rare earth element.

19. The crystal growth method of an oxide according to claim 17 wherein, when said rare earth oxide is epitaxially grown, said source material containing at least one kind of rare earth element being supplied after the supply of said oxidic gas onto the surface of said silicon substrate is started.

20. The crystal growth method of an oxide according to claim 17 further comprising the step of annealing said rare earth oxide in vacuum with a pressure not higher than $1\times10^{-6}$ Torr at a temperature not lower than the growth temperature of said rare earth oxide after said rare earth oxide is epitaxially grown.

21. The crystal growth method of an oxide according to claim 17 further comprising the step of homoepitaxially growing another rare earth oxide on said rare earth oxide at a growth temperature higher than the growth temperature of said rare earth oxide after said rare earth oxide is epitaxially grown.

22. The crystal growth method of an oxide according to claim 17 further comprising the step of epitaxially growing a functional oxide on said rare earth oxide after said rare earth oxide is epitaxially grown.

23. The crystal growth method of an oxide according to claim 22 wherein said functional oxide has a perovskite structure or a layered perovskite structure.

24. The crystal growth method of an oxide according to claim 17 wherein a silicon oxide film or a defective layer not thicker than 5 nm is formed along the interface between said silicon substrate and said rare earth oxide.

25. The crystal growth method of an oxide according to claim 17 wherein said rare earth oxide is cerium dioxide or yttrium oxide.

26. The crystal growth method of an oxide according to claim 17 wherein said rare earth oxide is epitaxially grown in an atmosphere containing an oxidic gas by using a source material made up of at least one kind of rare earth element, and in this process, said source material containing at least one kind of rare earth element is supplied after the supply of said oxidic gas onto the surface of said silicon substrate is started.

27. The crystal growth method of an oxide according to claim 26 wherein said source material containing at least one kind of rare earth element is made up of a rare earth oxide.

28. The crystal growth method of an oxide according to claim 17 wherein said rare earth oxide is epitaxially grown at a growth temperature not higher than 300° C.

29. The crystal growth method of an oxide according to claim 17 wherein said rare earth oxide is epitaxially grown at a growth temperature not higher than 100° C.

* * * * *